US 6,797,646 B2

(12) United States Patent
Ngai et al.

(10) Patent No.: US 6,797,646 B2
(45) Date of Patent: Sep. 28, 2004

(54) METHOD OF NITROGEN DOPING OF FLUORINATED SILICATE GLASS (FSG) WHILE REMOVING THE PHOTORESIST LAYER

(75) Inventors: Christopher Ngai, Burlingame, CA (US); Christopher D. Bencher, Sunnyvale, CA (US); Joe Feng, Cupertino, CA (US); Peter Chen, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 245 days.

(21) Appl. No.: 09/759,854

(22) Filed: Jan. 12, 2001

(65) Prior Publication Data

US 2002/0133258 A1 Sep. 19, 2002

(51) Int. Cl.[7] .................. H01L 21/31; H01L 21/469
(52) U.S. Cl. .................. 438/778; 438/784; 438/787; 438/788
(58) Field of Search .................. 438/622, 628, 438/638, 687, 784, 787, 768

(56) References Cited

U.S. PATENT DOCUMENTS

| 6,077,764 A | 6/2000 | Sugiarto et al. | |
|---|---|---|---|
| 6,191,046 B1 | * 2/2001 | Singh et al. | 438/723 |
| 6,342,448 B1 | * 1/2002 | Lin et al. | 438/687 |

OTHER PUBLICATIONS

Baliga, John, "New Materials Enhance Memory Performance," *Semiconductor International* (Nov. 1999) pp.:79–90.

DeJule, Ruth, "SOI Comes of Age," *Semiconductor International* (Nov. 1999) pp.: 67–74.

Peters, Laura, "Solving the Integration Challenges of Low–k Dielectrics," *Semiconductor International* (Nov. 1999) pp.: 56–64.

Peters, Laura, "Pursuing the Perfect Low–k Dielectric," *Semiconductor International* (Sep. 1998) pp.: 64–74.

Singer, Peter, "Dual–Damascene Challenges Dielectric Etch," *Semiconductor International* (Aug. 1999) pp.: 68–72.

* cited by examiner

*Primary Examiner*—W. David Coleman
*Assistant Examiner*—William M. Brewster
(74) *Attorney, Agent, or Firm*—Townsend & Townsend & Crew

(57) ABSTRACT

Embodiments of the present invention provide nitrogen doping of a fluorinated silicate glass (FSG) layer to improve adhesion between the nitrogen-containing FSG layer and other layers such as barrier layers. In some embodiments, a nitrogen-containing FSG layer is deposited on a substrate in a process chamber by supplying a gaseous mixture to the process chamber. The gaseous mixture comprises a silicon-containing gas, a fluorine-containing gas, an oxygen-containing gas, and a nitrogen-containing gas. Energy is provided to the gaseous mixture to deposit the nitrogen-containing FSG layer onto the substrate. A plasma may be formed from the gaseous mixture to deposit the layer. In some embodiments, an FSG film that has been formed is doped with nitrogen by a plasma treatment using a nitrogen-containing chemistry. For example, nitrogen ashing in a damascene process may introduce nitrogen dopants into the surface of the FSG layer. The nitrogen-containing FSG layer exhibits good adhesion with barrier layers for copper such as those including tantalum, tantalum nitride, or the like.

10 Claims, 8 Drawing Sheets

METHOD OF NITROGEN DOPING OF FLUORINATED SILICATE GLASS (FSG) WHILE REMOVING THE PHOTORESIST LAYER

BACKGROUND OF THE INVENTION

The present invention relates to the manufacture of integrated circuits. Specific embodiments of the invention are directed to nitrogen doping of FSG films for use in such circuits.

In conventional integrated circuit fabrication, circuit elements are formed by etching a pattern of gaps in a layer of metal, which are then filled with a dielectric. As efforts continue to include ever greater levels of integration on semiconductor chips, there has developed a persistent need to make circuit components (such as transistors, capacitors, etc.), smaller, bringing the components closer together, thereby allowing a greater number of components per unit of chip area. Increasing the component density on semiconductor chips results in increased sensitivity of operating speed and power consumption on the dielectric constant k of the material used to insulate the electrically conductive structures. If the dielectric constant is too high, the capacitance between the chip's metal lines becomes too large, creating undesirable cross talk across layers.

Various forms of silicon oxide or silicon-oxide-based glass are commonly used as the insulating material in integrated-circuit fabrication. While silicon oxide has an acceptably low dielectric constant for many applications, a lower dielectric constant is preferable for some applications, such as those involving a high density of circuit components. The RC time delay increases with an increase in the resistance of the conductive layers, such as metal lines, and with an increase in the capacitance which exists as insulating material sandwiched between conducting films (R is resistance, C is capacitance). The parasitic capacitance between interconnections leads to degradation in switching speeds and causes cross talk between adjacent signal lines. Lowering the dielectric constant reduces RC time delays by decreasing the capacitances, contributing to an overall improvement in the circuit's operation speed. One method of forming an insulator with a lower dielectric constant than undoped silicate glass ("USG") involves adding fluorine to silicon oxide during a chemical-vapor-deposition ("CVD") process. The presence of the fluorine dopants in the resulting fluorinated silicate glass ("FSG") is known to have the desired lowering effect on dielectric constant.

Another factor to be considered in developing methods for depositing films with appropriate dielectric constant is that copper, which has lower resistance than conventional aluminum alloys, is poised to take over as the main on-chip conductor for all types of integrated circuits. It is more difficult to etch copper than aluminum and a specialized process, referred to as a "damascene process," has been developed for the fabrication of copper-based integrated circuits. In damascene processes, dielectric layers are first deposited as an integrated stack, which is then etched to form gaps to be subsequently filled with the conductive material. A barrier layer, which can be overlying or underlying, is commonly included to prevent diffusion of copper into adjacent dielectric layers. Some integrated stacks used in damascene processes also use a layer known as an "etch stop" or "hardmask" to provide for selective etching of the film. Silicon nitride ($Si_xN_y$) is a material commonly used for such applications, for example when forming vias between layers containing metal lines.

The use of FSG can present adhesion problems. For instance, adhesion problems have arisen at the interface between the FSG layer and the barrier layer formed in the damascene process prior to forming the bulk copper layer. Bubbling and even peeling have been observed for barrier layers containing, for example, tantalum (Ta), tantalum nitride (TaN), or the like. It is believed that the fluorine in the FSG layer diffuses into the barrier layer and attacks and corrodes the barrier layer, resulting in poor adhesion.

SUMMARY OF THE INVENTION

Embodiments of the present invention provide nitrogen doping of an FSG layer to form a nitrogen-containing FSG layer with improved adhesion to layers such as barrier layers. In some embodiments, a nitrofluorinated silicate glass (NFSG) layer having nitrogen dopants distributed generally over the entire layer is formed on a substrate by CVD of a gaseous mixture of silicon-containing, fluorine-containing, oxygen-containing, and nitrogen-containing gases. In some embodiments, an FSG film that has been formed is doped with nitrogen by a plasma treatment using a nitrogen-containing chemistry. For instance, the nitrogen plasma treatment may occur during ashing of the photoresist after etching to form trenches or vias and prior to forming the barrier layer in a damascene process. Such a film has nitrogen dopants localized near the surface subjected to the doping treatment.

The nitrogen-containing FSG layer exhibits excellent adhesion to an overlying or underlying barrier layer as may be required in certain applications. Moreover, the NFSG layer exhibits a reduction in dielectric constant, which may be attributable to the inclusion of nitrogen dopants in the film that is believed to allow higher fluorine concentrations in the layer without sacrificing film stability. The enhanced stability exhibited by the film lessens integration concerns that otherwise exist with both FSG and USG. Various embodiments of the invention are applicable to damascene and other applications such as gap-fill applications.

In accordance with an aspect of the present invention, a method for depositing a layer on a substrate in a process chamber includes supplying a gaseous mixture to the process chamber. The gaseous mixture has a silicon-containing gas, a fluorine-containing gas, an oxygen-containing gas, and a nitrogen-containing gas. Energy is provided to the gaseous mixture to deposit a nitrogen-containing fluorinated silicate glass layer onto the substrate. In some embodiments, a plasma is formed from the gaseous mixture to deposit the layer. A barrier layer is formed on the nitrogen-containing fluorinated silicate glass layer, and a metal layer is formed on the barrier layer. The barrier layer may include copper, and the barrier layer may include tantalum, tantalum nitride, or the like.

In accordance with another aspect of the invention, a method of forming a layer on a substrate in a process chamber includes forming a fluorinated silicate glass layer over the substrate. A patterned photoresist layer is formed over the fluorinated silicate glass layer. The fluorinated silicate glass layer is etched according to the patterned photoresist layer. The method further includes removing the photoresist layer and substantially simultaneously introducing nitrogen dopants into the fluorinated silicate glass layer by subjecting the photoresist layer and the fluorinated silicate glass layer to a plasma formed from a nitrogen-containing gas. In some embodiments, the plasma contains no oxygen species.

The methods of the present invention may be embodied in a computer-readable storage medium having a computer-readable program embodied therein for directing operation of substrate processing system. Such a system may include a process chamber, a plasma generation system, a substrate support, a gas delivery system, and a system controller. The computer-readable program includes instructions for operating the substrate processing system to form a thin film on a substrate disposed in the processing chamber in accordance with the embodiments described above.

DESCRIPTION OF THE SPECIFIC EMBODIMENTS

I. Introduction

Embodiments of the present invention are directed to nitrogen doping of an FSG layer to improve adhesion between the nitrogen-containing FSG layer and other layers such as barrier layers that include tantalum, tantalum nitride, or the like. Nitrogen doping of an FSG layer can be performed in various ways. For example, a nitrofluorinated silicate glass (NFSG) layer is formed on a substrate by CVD of a gaseous mixture of silicon-containing, fluorine-containing, oxygen-containing, and nitrogen-containing gases. The NFSG layer has nitrogen dopants distributed generally over the entire layer, and is typically formed in a plasma process. An FSG layer that has been formed may be doped with nitrogen by a plasma treatment using a nitrogen-containing chemistry to form a nitrogen-containing FSG layer. Such a layer may include nitrogen dopants only in a relatively thin region near the surface of the FSG layer subjected to the nitrogen plasma treatment. For instance, the nitrogen plasma treatment may occur during ashing of the photoresist after etching to form trenches or vias and prior to forming the barrier layer in a damascene or a dual-damascene process.

Figure 1A:
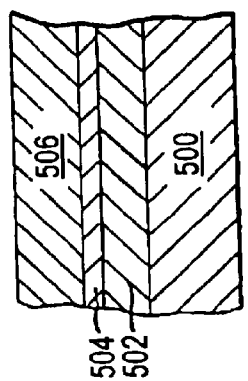
FIGS. 1(a)–1(h) depict a cross-section of a partially formed integrated circuit undergoing an integrated dual-damascene process according to an embodiment of the present invention.
Figure 1B:
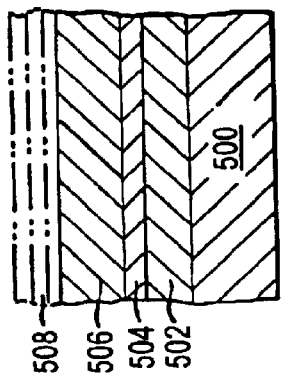
Figure 1C:
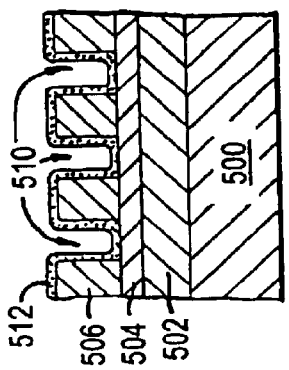

An example of a dual-damascene process integration scheme that may benefit from nitrogen doping of the FSG layer in forming an IMD layer is depicted in FIGS. 1(a)–1(h). The dual damascene process begins with the deposition of an oxide layer 502 over a silicon substrate 500 as shown in FIG. 1(a). A barrier layer 504 is deposited over oxide layer 502, e.g., by HDP-CVD using $SiH_4$ and $N_2$ or PECVD using $SiH_4+NH_3/N_2$. In some applications, layer 504 acts as a hardmask or etch-stop layer. A first nitrogen-containing FSG layer 506 is deposited, e.g., using the HDP-CVD method described above. First nitrogen-containing FSG layer 506 may be deposited in the same chamber as barrier layer 504 to enhance process integration. A first patterned photoresist layer 508 covers nitrogen-containing FSG layer 506 during a first photolithography as shown in FIG. 1(b). A first etch forms a first set of gaps 510 in first nitrogen-containing FSG layer 506 down to hardmask layer 504 as shown in FIG. 1(c).

Figure 1D:
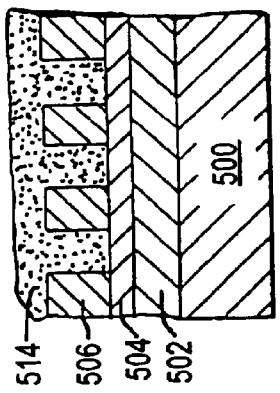

After the first etch, photoresist 508 is stripped, e.g., by ashing in an oxidizing environment. Gaps 510 and first nitrogen-containing FSG layer 506 are then covered with a layer of metal, such as aluminum or copper. In some embodiments, a barrier layer 512 is deposited over first nitrogen-containing FSG layer 506 and gaps 510 (FIG. 1(c). The barrier layer 512 prevents interdiffusion of copper and nitrogen-containing FSG. In the case of copper, a seed layer (not shown) is deposited over gaps 510 and first nitrogen-containing FSG layer 506, or over the barrier layer 512 if present. A first bulk copper layer 514 is deposited to fill the gaps 510 as shown in FIG. 1(d). Copper layer 514 is planarized, e.g., by chemical and mechanical polishing (CMP). Planarization of copper layer 514 forms, e.g., a first set of metal lines 515 in an interconnect structure.

Figure 1E:
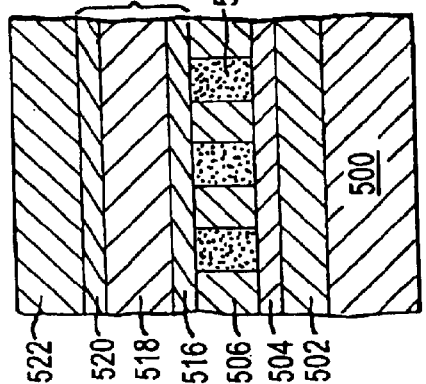
Figure 1F:
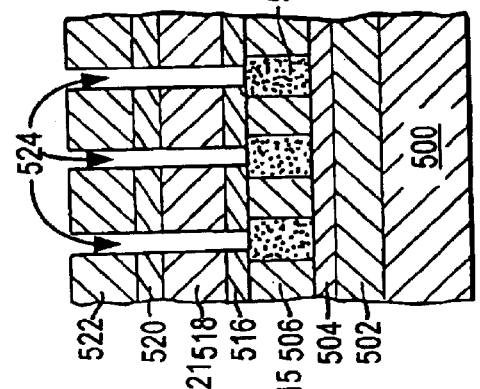
Figure 1G:
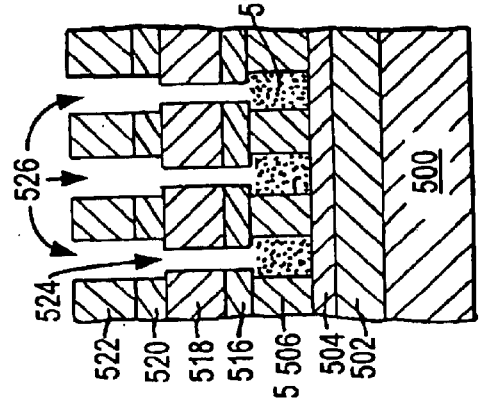
Figure 1H:
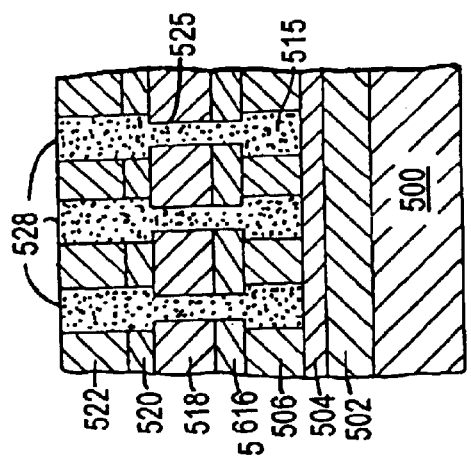

After planarization, of copper layer 514, a second barrier layer 516, a second nitrogen-containing FSG layer 518, a third barrier layer 520 and third nitrogen-containing FSG layer 522 are deposited to form an IMD layer 521 as shown in FIG. 1(e). Second nitrogen-containing FSG layer 518 and third nitrogen-containing FSG layer 522 may be deposited by HDP-CVD as described above. Layers 518, 520, and 522 may be deposited in the same chamber, e.g., by HDP-CVD, without removing substrate 500 to enhance process integration for forming IMD layer 521. To prevent oxidation of copper layer 514 and contamination of the chamber, substrate 500 may be heated in a high-density Argon plasma without oxygen prior to depositing second FSG layer 518. A second lithography and etch process forms vias 524 through layers 516, 518, 520 and 522 down to copper layer 514 as shown in FIG. 1(f). In FIG. 1(g), a third lithography and etch process forms a second set of gaps 526. Gaps 526 define a second set of metal lines and vias 524 define a set of interconnects between the second set of metal lines and the first set of metal lines defined by gaps 510 and copper layer 514. Vias 524 and gaps 526 are then filled with a second bulk copper layer and the resulting structure is annealed and planarized as shown in FIG. 1(h). Gaps 526 define a second set of metal lines 528 and vias 524 define a set of interconnects 525 between the second set of metal lines 528 and the first set of metal lines 515.

Damascene processes are used in devices that use copper interconnects because there is currently no acceptable way to etch copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 504, 516 and 520 can be silicon nitride layers. Alternatively, it may be desirable to deposit one or more of barrier layers 504, 516 and 520 as silicon-carbon low-k barrier layers such as BLOK™ (Barrier Low K). BLOK™ is a trademark of Applied Materials, Inc. of Santa Clara, Calif.

Adhesion problems have arisen at the interface between the FSG layer and the barrier layer 512 formed in the damascene process without nitrogen doping. Bubbling and even peeling have been observed for barrier layers containing, for example, tantalum (Ta), tantalum nitride (TaN), or the like. It is believed that the fluorine in the FSG layer diffuses into the barrier layer and attacks and corrodes the barrier layer, resulting in poor adhesion. As described in more detail below, nitrogen doping of the FSG layers 506, 518, 522 alleviates the adhesion problems.

Figure 2:
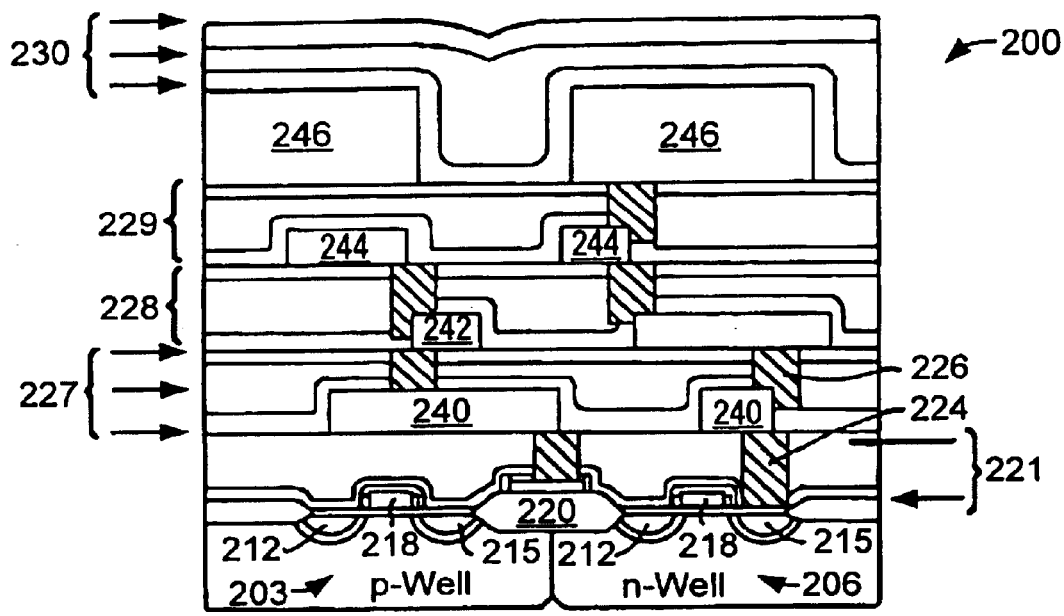
FIG. 2 is a simplified cross-sectional view of a semiconductor device manufactured according to the method of the present invention.

FIG. 2 illustrates a simplified cross-sectional view of an integrated circuit 200, which may be made in accordance with specific embodiments of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a groove trench isolation (not shown) when transistors 203 and 206 are both NMOS or both PMOS. Each transistor 203, 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, 246 is separated from adjacent metal layers by respective intermetal dielectric (IMD) layers 227, 228, 229. Any or all of IMD layers 227, 228, 229 can be deposited in accordance with embodiments of the present invention. Adjacent metal layers are connected at selected openings by vias 226. Deposited over metal layer 246 are planarized passivation layers 230.

It should be understood that simplified integrated circuit 200 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

II. CVD of Nitrogen-Containing FSG

A nitrogen-containing FSG layer may be formed by CVD on a substrate in a process chamber. A gaseous mixture including a silicon-containing gas, a fluorine-containing gas, an oxygen-containing gas, and a nitrogen-containing gas is flowed into the process chamber, and energy is provided to the gaseous mixture to deposit the nitrogen-containing FSG layer on the substrate. The nitrofluorinated silicate glass (NFSG) layer so formed has nitrogen dopants distributed generally over the entire layer. In specific embodiments, a plasma is formed from the gaseous mixture to deposit the NFSG layer. The plasma may be generated remotely from the process chamber, or an in situ plasma may be formed in the process chamber. The plasma may be produced using a variety of methods.

In one embodiment, the silicon-containing gas is TEOS and a carrier gas such as helium is used. The fluorine-containing gas is $SiF_4$, and the oxygen-containing gas is $O_2$. The nitrogen-containing gas may be $N_2$, $N_2O$, $NH_3$, $NF_3$, or the like. A suitable capacitively coupled PECVD apparatus for depositing the NFSG is described herein below. Examples of systems and methods of depositing FSG layers can be found in commonly assigned U.S. Pat. Nos. 6,121,164, 6,103,601, and 6,077,764.

In some embodiments, a high density plasma (HDP) may be employed to deposit an HDP CVD NFSG layer. A suitable HDP CVD apparatus for depositing the HDP CVD NFSG layer is described in commonly assigned U.S. patent application Ser. No. 08/679,929, filed Jul. 15, 1996.

Figure 3:
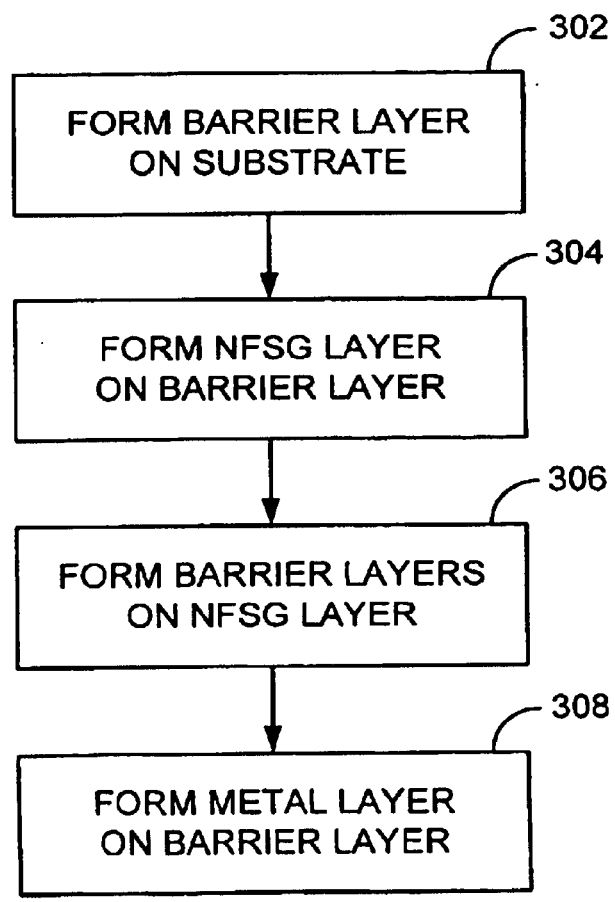
FIG. 3 is a flow diagram of a method of forming a stack including a nitrogen-containing FSG layer according to an embodiment of the present invention.

In one exemplary embodiment as shown in FIG. 3, a barrier layer (e.g., Ta or TaN) is formed on a substrate in step 302, and an NFSG layer is formed over the barrier layer (step 304). In step 306, another barrier layer is formed on the NFSG layer. A metal layer (e.g., copper) is then formed on the barrier layer in step 308. The nitrogen doping of the FSG layer improves the adhesion with the barrier layers.

A. Exemplary CVD System

Figure 4:
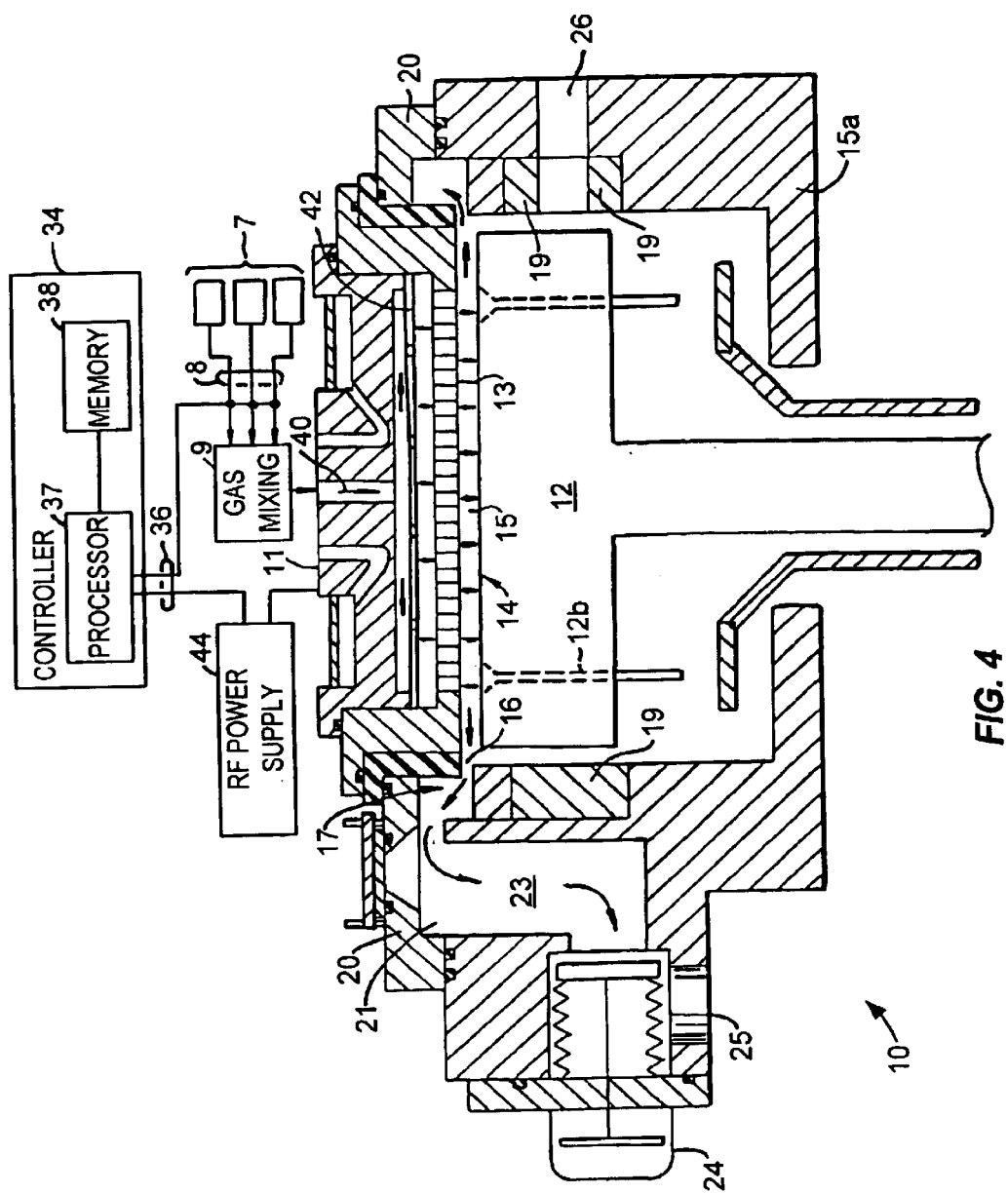
FIG. 4 is a vertical, cross-sectional view of one embodiment of a chemical vapor deposition apparatus according to the present invention.
Figure 5:
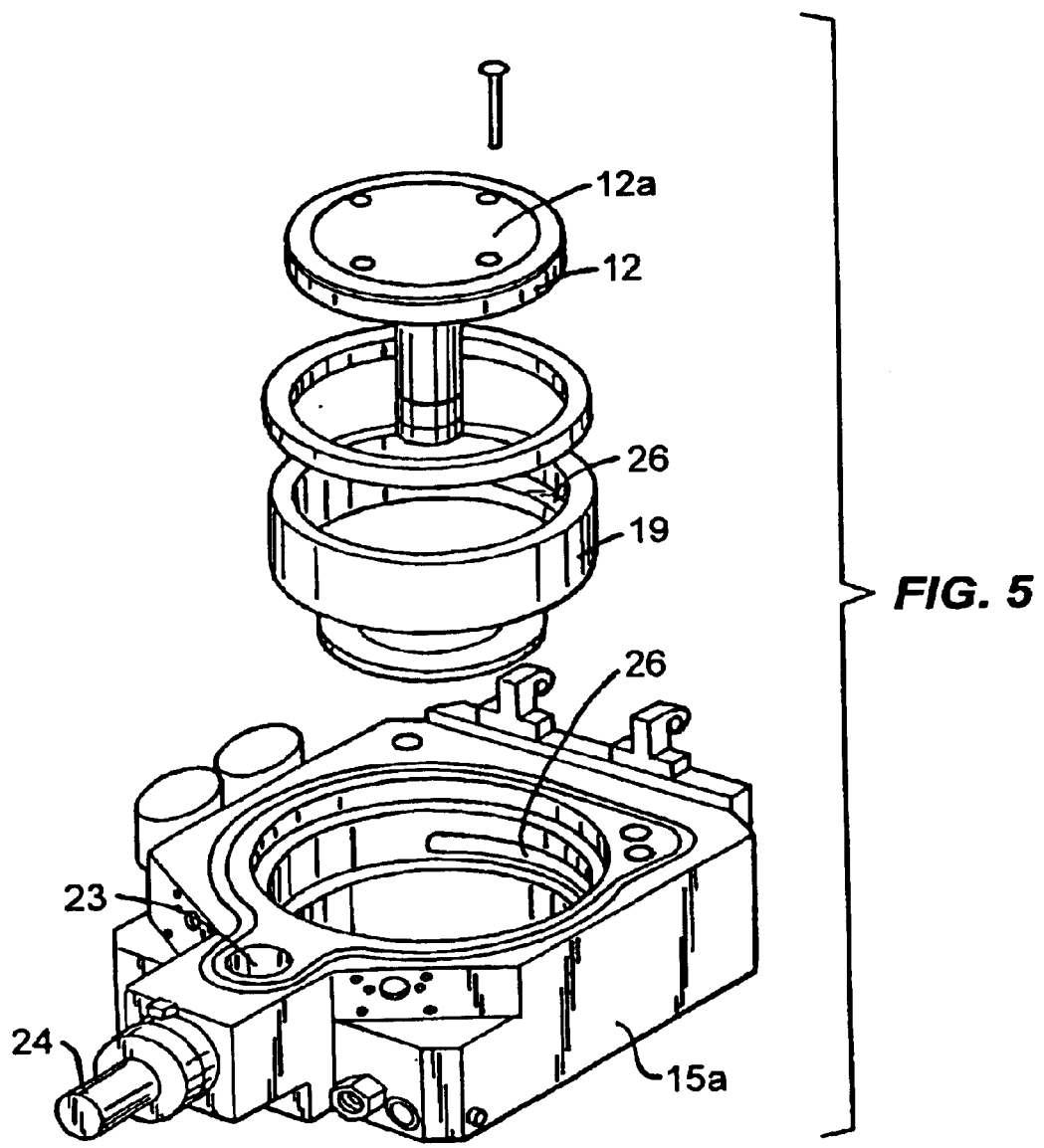
FIGS. 5 and 6 are exploded perspective views of parts of the CVD chamber depicted in FIG. 4.
Figure 6:
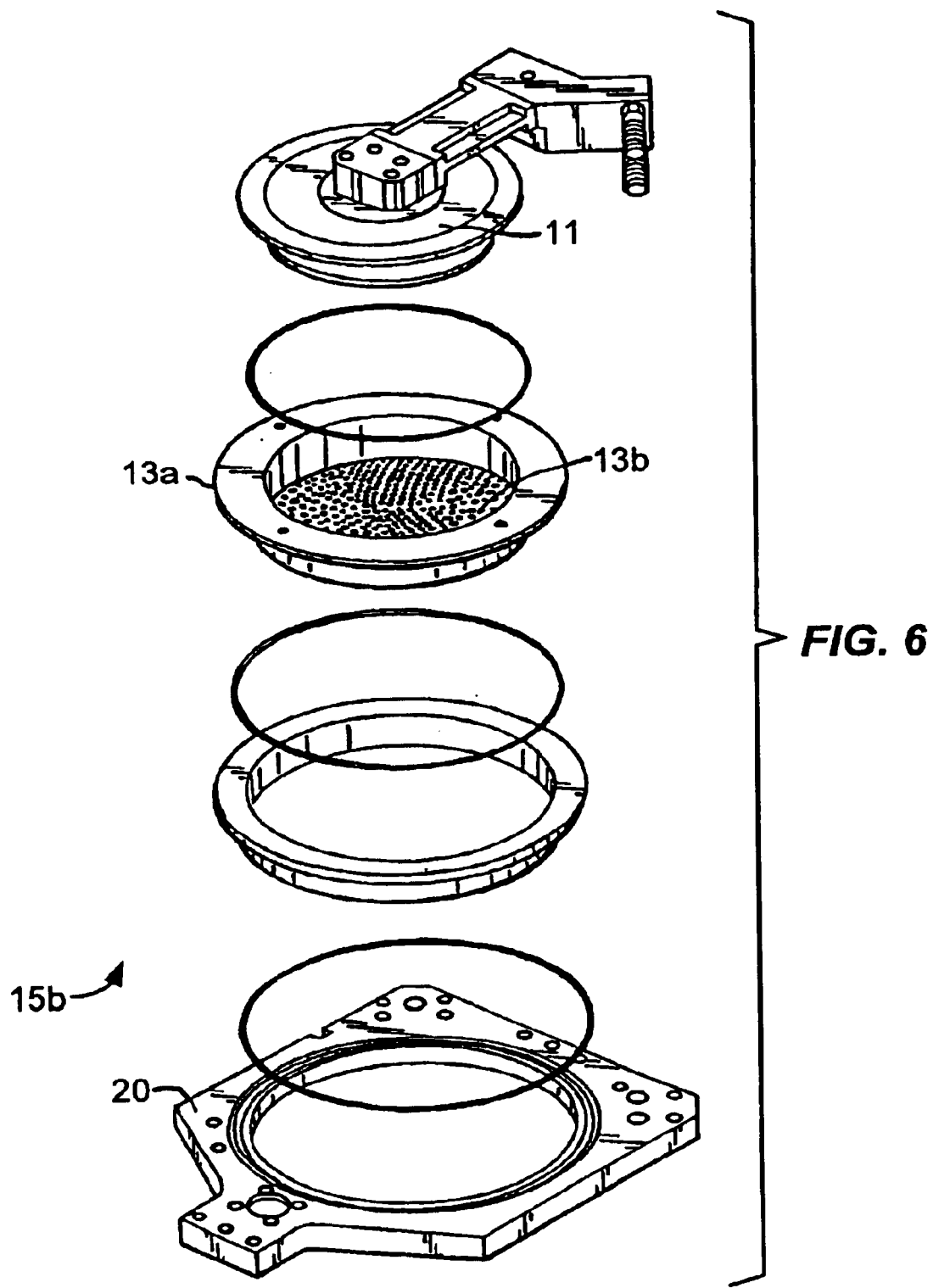

One suitable CVD apparatus in which the method of the present invention can be carried out is shown in FIG. 4, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 5 and 6.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (not shown) and an upper processing position (shown in FIG. 4), which is closely adjacent to manifold 11. A centerboard (not shown) includes sensors for providing information on the position of the wafers.

Deposition and carrier gases are introduced into chamber 15 through perforated holes 13b (FIG. 6) of a conventional flat, circular gas distribution or faceplate 13a. More specifically, deposition process gases flow into the chamber through the inlet manifold 11 (indicated by arrow 40 in FIG. 4), through a conventional perforated blocker plate 42 and then through holes 13b in gas distribution faceplate 13a.

Before reaching the manifold, deposition and carrier gases are input from gas sources 7 through gas supply lines 8 (FIG. 4) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency ($RF_1$) of 13.56 MHz and at a low RF frequency ($RF_2$) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360 circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 4) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 7:
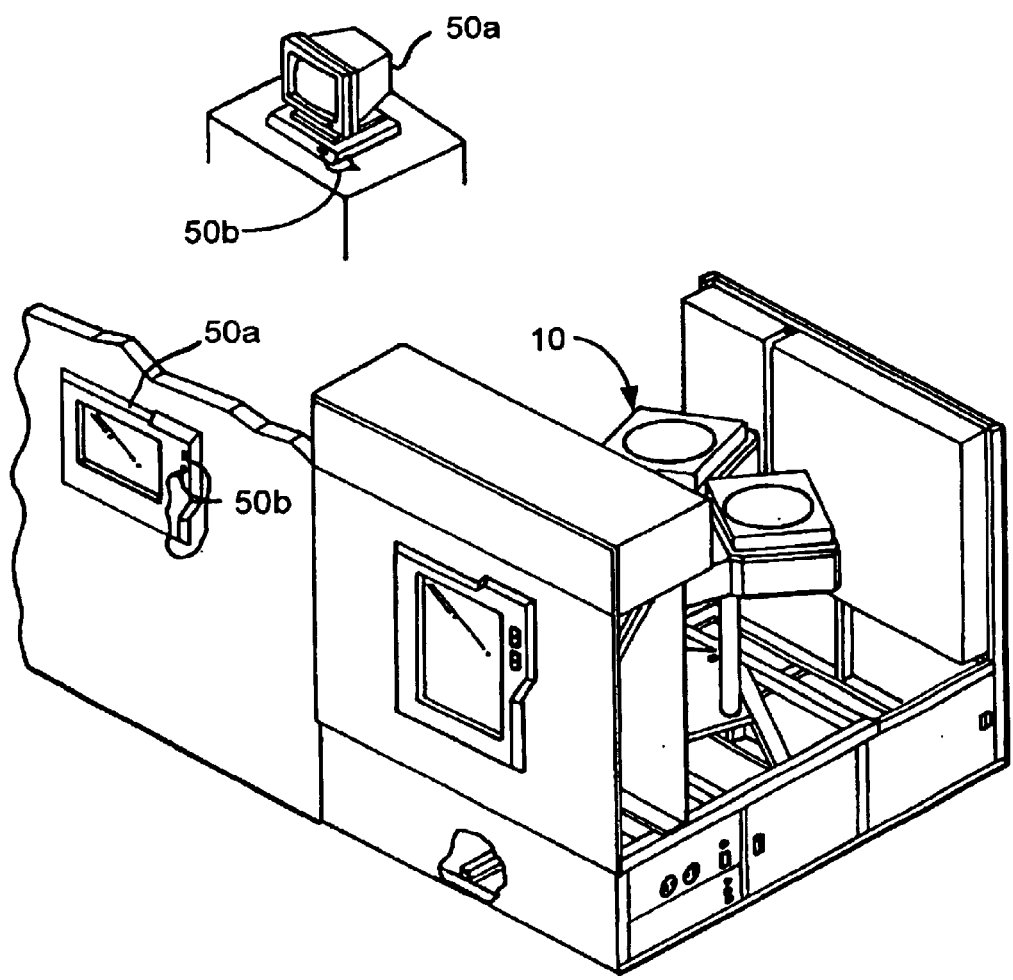
FIG. 7 is a simplified diagram of system monitor and CVD system in a multichamber system, which may include one or more chambers.

The interface between a user and controller 34 is via a CRT monitor 50a and light pen 50b, shown in FIG. 7, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 8:
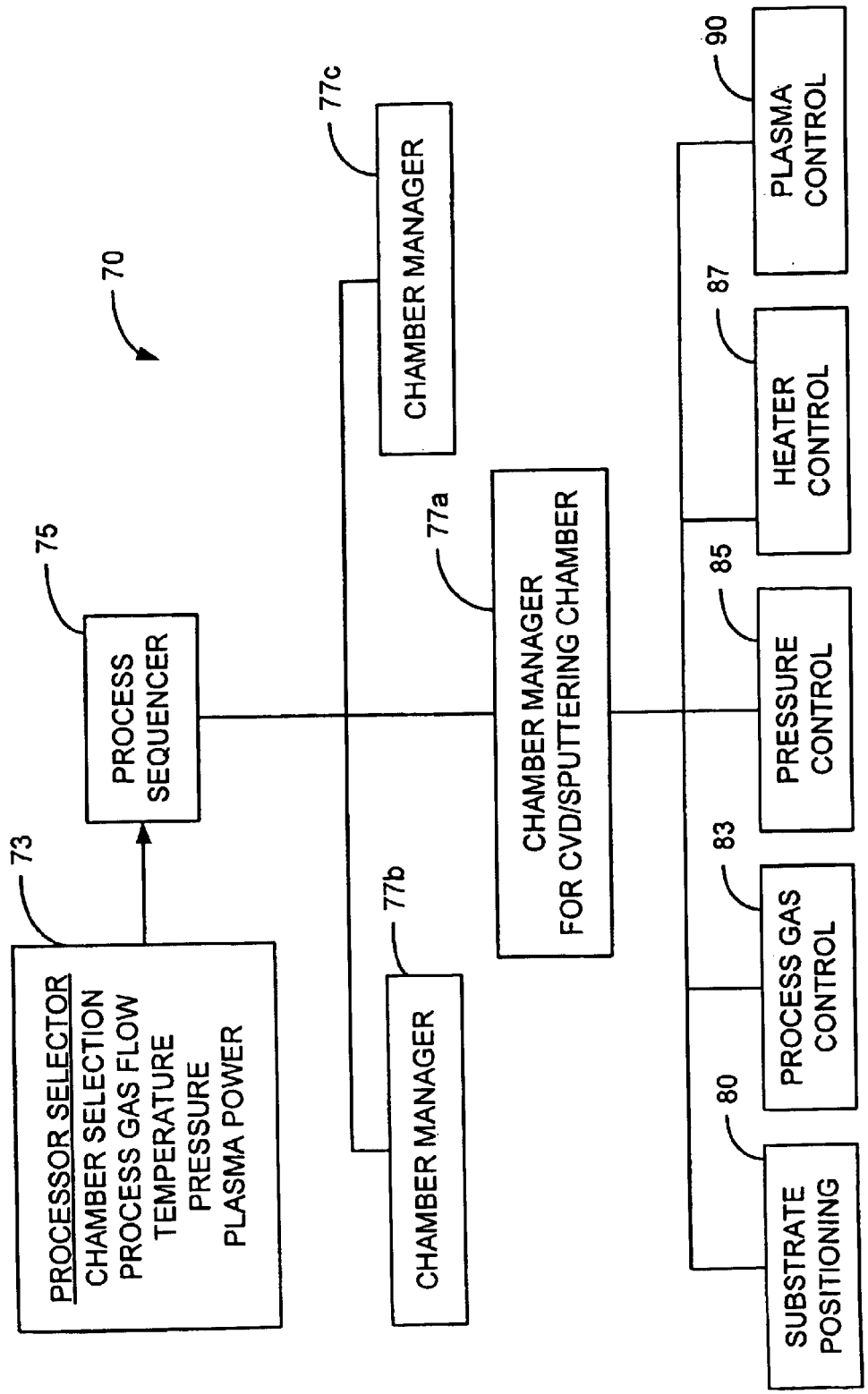
FIG. 8 shows an illustrative block diagram of the hierarchical control structure of the system control software, computer program, according to a specific embodiment.

FIG. 8 is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a-c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 8. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77*a*. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77*a* and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77*a*.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

B. Test Results

Significant improvement in adhesion for the nitrogen-containing FSG layer is achieved even with a relatively low levels of nitrogen doping. Typically, the nitrogen content in the nitrogen-containing FSG layer may be less than about 5 atomic % (at. %), or less than about 1 at. %, or even less than about 0.1 at. %. In specific examples, the nitrogen content is about 0.03 to about 0.08 at. %. The flow rate of the nitrogen containing gas typically is relatively low to obtain these nitrogen content levels. For instance, the ratio between the flow rate of the nitrogen-containing gas and the total flow rate of the gaseous mixture may be about 10% or lower.

In one example, an NFSG layer was deposited from TEOS at about 1900 sccm, $O_2$ at about 1200 sccm, He at about 3400 sccm, $N_2O$ at about 600 sccm, and $SiF_4$ at about 1700 sccm for about 4.5% F concentration or about 3600 sccm for about 6% F concentration. The deposition pressure was about 3.7 torr. The high frequency RF power was about 105 W, and the low frequency RF power was about 300 W. In another example, the NFSG deposition employed TEOS at about 950 sccm, $O_2$ at about 600 sccm, He at about 1700 sccm, $N_2O$ at about 300 sccm, and $SiF_4$ at about 950 sccm for 4.5% F concentration or about 1700 sccm for 6% F concentration. The deposition pressure was about 3.7 torr. The high frequency RF power was about 110 W, and the low frequency RF power was about 300 W. In both examples, the introduction of relatively small amounts of nitrogen produces NFSG layers having no adhesion problems with TaN barrier layers such as peeling, bubbling, and the like.

The NFSG layer avoids adhesions problems with TaN barrier layers or the like either below or above the NFSG layer, since the entire NFSG layer is doped with nitrogen. Further, the addition of nitrogen dopants during the CVD process to deposit an NFSG may produce additional beneficial effects on the material properties of the film when compared with FSG. One benefit of including nitrogen is a reduction in the dielectric constant of the deposited film. If an FSG layer and an NFSG layer are deposited under similar conditions (i.e. deposition parameters and flow rates), except for the inclusion of nitrogen, then the NFSG film is observed to have a dielectric constant approximately 5% lower than the dielectric constant for the FSG film. It is known that an increase in fluorine concentration is correlated with a decrease in dielectric constant. Fluorine dopants in silicon oxide films act to reduce the dielectric constant but the diffusion adversely affects the stability of the film. A specific benefit of adding nitrogen is that its presence permits the concentration of fluorine in the film to be greater without impeding the deposition of a stable film. The additional introduction of nitrogen limits the degree of fluorine diffusion, even at relatively high fluorine concentrations, so that improved film stability is achieved with the NFSG layer. The reduction in the dielectric constant translates directly into a corresponding increase in performance speed for integrated circuits manufactured with the process.

In typical processes for depositing the NFSG layer, the pressure is about 2–8 torr; the high frequency RF power is about 100–1200 W; and the low frequency RF power is about 200–600 W. When $SiF_4$ is used as the fluorine source and $N_2O$ is used as the nitrogen source, the ratio of the flow rates of $SiF_4$ to $N_2O$ is about 1:1–3:1. These ranges are merely illustrative and can be varied depending on the particular application and the desired film characteristics.

III. Plasma Ash Using Nitrogen-Containing Chemistry

Figure 9:
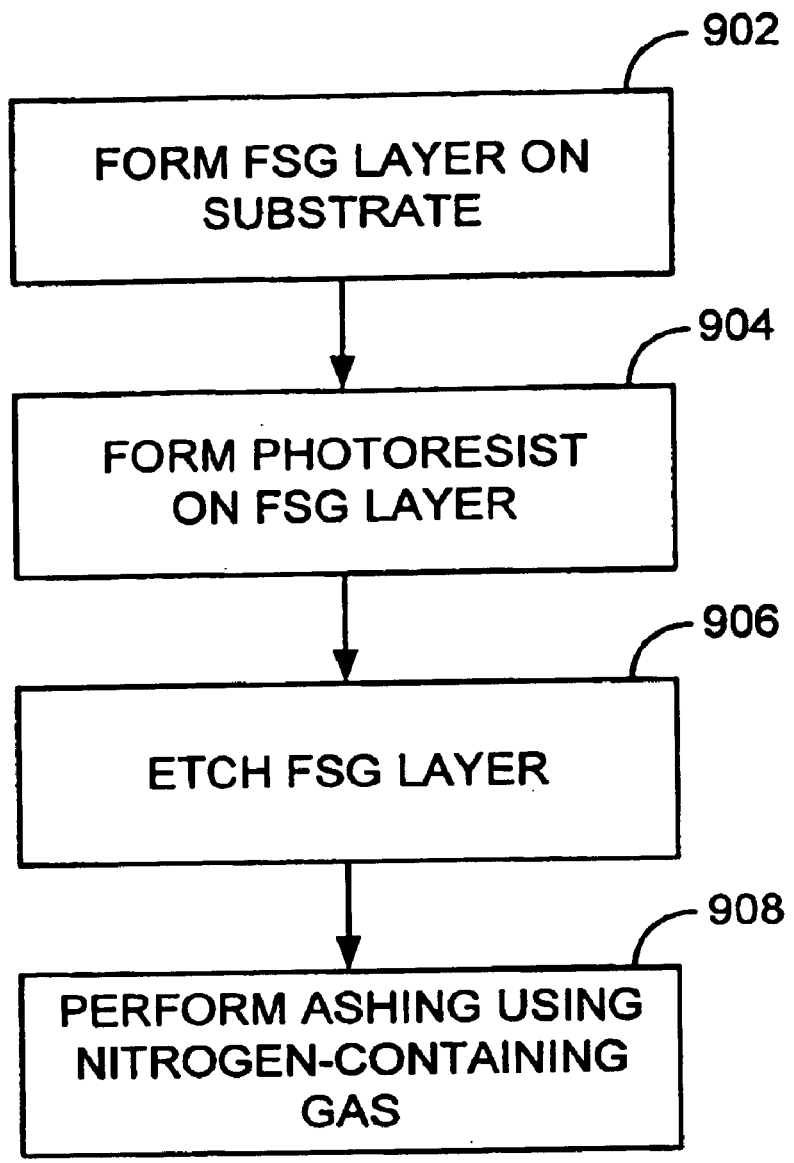
FIG. 9 is a flow diagram of a method of forming a nitrogen-containing FSG layer according to another embodiment of the present invention.

Another method of incorporating nitrogen into an FSG layer is by subjecting the FSG layer to a plasma generated from a nitrogen-containing gas. For instance, this can take place during ashing of the post-etch photoresist. In a specific embodiment as illustrated in FIG. 9, an FSG layer is formed over a substrate (step 902), and a patterned photoresist layer is formed over the FSG layer (step 904). The FSG layer is then etched according to the patterned photoresist layer to form gaps, vias, or the like (step 906). To remove the post-etch photoresist, the structure is subjected to a plasma in an ashing step (step 908). Conventional ashing typically employs either a downstream flow of reactive oxygen generated, e.g., in a microwave downstream plasma system, or an active oxygen plasma produced in an RF plasma chamber from an oxygen containing gas, to remove or dry-etch the photoresist and post-etch residues.

The ashing in specific embodiments of the invention may employ both an oxygen-containing gas and a nitrogen-containing gas (e.g., $O_2$ and $NH_3$). In some preferred embodiments, no oxygen-containing gas is used in the ashing step 906. In such cases, ashing is performed by a plasma formed from one or more nitrogen-containing gases (e.g., $NH_3$ and/or $N_2$). During ashing with a nitrogen plasma, nitrogen dopants are substantially simultaneously introduced into the FSG layer. The nitrogen dopants are incorporated into the FSG layer typically in a region near the surface of the FSG layer which is exposed to the plasma formed from the nitrogen-containing gas. This region may be quite thin, e.g., less about 200 Å. The nitrogen content in the nitrogen-doped region may be less than about 10 at. %, and is typically about 1 to about 5 at. %.

The following table summarizes the results for three examples used to illustrate to effect of the ashing process on TaN adhesion with the FSG layer.

| FSG | Etch | Ash | TaN | [C] by XPS | [N] by XPS | [O] by XPS | [F] by XPS | [Si] by XPS |
|---|---|---|---|---|---|---|---|---|
| 6% TEOS FSG | Ox BKM | Plasma $O_2$ | BKM 30% N | 2.4 | — | 62 | 5.9 | 30 |
| 6% TEOS FSG | Ox BKM | Plasma $NH_3$ + $O_2$ | BKM 30% N | 1.7 | 0.6 | 61 | 6.3 | 31 |
| 6% TEOS FSG | Ox BKM | Plasma $NH_3$ + $N_2$ | BKM 30% N | 2.0 | 5.2 | 48 | 18 | 27 |

In the example with the plasma $O_2$ ash, severe peeling occurred over much of the interface between the FSG layer and the TaN layer. When nitrogen was introduced in the plasma $NH_3$ and $O_2$ ash, no peeling occurred, but bubbling was observed over the FSG-TaN interface. The nitrogen content observed by X-ray photoelectron spectrometry (XPS) was about 1.7 at. %. In the example involving ashing in plasma $NH_3+N_2$ with no oxygen, about 95% of the FSG-TaN interface was free of adhesion problems. Some bubbling occurred over a small region around the edge of the wafer. The nitrogen content was about 5.2 at. %. The experiment was conducted to demonstrate the effectiveness of a plasma ash with nitrogen-containing chemistry in solving the adhesion problem, and had not been optimized in terms of the process recipe and hardware. It is believed that even better results can be achieved by optimizing the process and hardware.

The above experiments employing specific process conditions and parameters are used merely for illustrative purposes, and are not intended to limit the invention.

In typical ash processes employing a nitrogen-containing gas for incorporating nitrogen into an FSG layer, the pressure is about 0.015–10 torr; the temperature is about 100–400° C.; and the plasma is either a microwave downstream plasma of about 500–4000 W or an active RF plasma of about 50–100 W. Any suitable nitrogen containing gas may be used. When $NH_3+N_2$ is used with no oxygen, the ratio of the flow rates of $NH_3$ to $N_2$ is about 0–100% (i.e., pure $NH_3$ or pure $N_2$ or any combination thereof). These ranges are merely illustrative and can be varied depending on the particular application and the desired film characteristics.

The above-described arrangements of apparatus and methods are merely illustrative of applications of the principles of this invention and many other embodiments and modifications may be made without departing from the spirit and scope of the invention as defined in the claims. For instance, different gas chemistries and process conditions may be used. Furthermore, although the damascene application is used to illustrate the various processes and features of the invention, other applications such as gap-fill may employ nitrogen doping of FSG layers to achieve similar and additional benefits. The scope of the invention should, therefore, be determined not with reference to the above description, but instead should be determined with reference to the appended claims along with their full scope of equivalents.

What is claimed is:

1. A method of forming a layer on a substrate in a process chamber, the method comprising:

forming a fluorinated silicate glass layer over the substrate;

forming a patterned photoresist layer over the fluorinated silicate glass layer;

etching the fluorinated silicate glass layer according to the patterned photoresist layer;

removing the photoresist layer and substantially simultaneously introducing nitrogen dopants into the fluorinated silicate glass layer by subjecting the photoresist layer and the fluorinated silicate glass layer to a plasma formed from a nitrogen-containing gas;

wherein the plasma contains no oxygen species.

2. The method of claim 1 wherein the nitrogen-containing gas is selected from the group consisting of $N_2$ and $NH_3$.

3. The method of claim 1 wherein the nitrogen-containing gas comprises at least one of $N_2$ and $NH_3$.

4. The method of claim 1 wherein nitrogen dopants are incorporated into the fluorinated silicate glass layer in a region near a surface of the fluorinated silicate glass layer which is exposed to the plasma formed from the nitrogen-containing gas.

5. The method of claim 4 wherein the region near the surface of the fluorinated silicate glass layer has a nitrogen content of less than about 10 at. %.

6. The method of claim 5 wherein the region near the surface of the fluorinated silicate glass layer has a nitrogen content of about 1 to about 5 at. %.

7. The method of claim 1 further comprising forming a barrier layer over the nitrogen-containing fluorinated silicate glass layer.

8. The method of claim 7 wherein the barrier layer comprises at least one of silicon-carbon, silicon nitride, tantalum and tantalum nitride.

9. The method of claim 7 further comprising forming a metal layer over the barrier layer.

10. The method of claim 9 wherein the metal layer comprises copper.

* * * * *